United States Patent [19]
Jenkins et al.

[11] Patent Number: 5,610,545
[45] Date of Patent: Mar. 11, 1997

[54] METHOD FOR PROVIDING PROGRAMMABLE HYSTERESIS LEVELS

[75] Inventors: Andrew Jenkins, San Jose; Peter S. Henry, Fremont; Gaylin M. Yee, Stanford, all of Calif.

[73] Assignee: Analog Devices, Inc., Norwood, Mass.

[21] Appl. No.: 462,779

[22] Filed: Jun. 5, 1995

[51] Int. Cl.$^6$ ..................................................... H03K 5/24
[52] U.S. Cl. ..................... 327/205; 327/68; 327/73
[58] Field of Search .......................... 327/205, 73, 77, 327/206, 78, 83, 87, 63, 72, 65–68, 79

[56] References Cited

U.S. PATENT DOCUMENTS

| | | | |
|---|---|---|---|
| 4,110,641 | 8/1978 | Payne | 327/73 |
| 4,677,315 | 6/1987 | Blauschild et al. | 327/205 |
| 4,859,873 | 8/1989 | O'Shaughnessy et al. | 307/290 |
| 4,926,068 | 5/1990 | Fujita | 327/205 |
| 4,940,907 | 7/1990 | Laude | 327/73 |
| 5,039,888 | 8/1991 | Bell et al. | 327/73 |
| 5,166,550 | 11/1992 | Matsubara et al. | 307/356 |
| 5,225,811 | 7/1993 | Audy | 340/584 |
| 5,264,740 | 11/1993 | Wright | 327/73 |
| 5,404,054 | 4/1995 | Kotowski | 327/73 |
| 5,408,694 | 4/1995 | Tran | 327/72 |

OTHER PUBLICATIONS

Low Power, Programmable Temperature Controll, TMP01, *Analog Devices Brochure*, Jul. 1994.

*Primary Examiner*—Timothy P. Callahan
*Assistant Examiner*—Eunja Shin
*Attorney, Agent, or Firm*—Koppel & Jacobs

[57] ABSTRACT

A method for providing programmable hysteresis levels includes producing output signals when an input signal crosses respective set points and establishing a hysteresis in the output signals. When a comparator's output signal is "on", the input signal is shifted by a hysteresis differential. The output signal is terminated when the shifted input signal returns to the set point. A programmable hysteresis input is adjusted to set the hysteresis differential to different preset and intermediate hysteresis levels.

4 Claims, 2 Drawing Sheets

METHOD FOR PROVIDING PROGRAMMABLE HYSTERESIS LEVELS

BACKGROUND OF THE INVENTION

1. Field of the Invention

The present invention generally relates to integrated circuits (ICs) that have a hysteresis capability, and more specifically to a method for programming an IC's hysteresis level by adjusting a programmable hysteresis signal.

2. Description of the Related Art

It would be desirable to provide an IC such as a temperature controller, an A/D converter, a comparator or a controller with the capability of having externally programmable hysteresis levels. These types of ICs typically compare an input signal to a set point to generate an output signal. Hysteresis prevents the output signal from jittering when the input signal is hovering near the set point, and also holds the output signal for a longer period of time. The output signal may be used, for example, in a temperature controller to trigger a cooling fan, produce a warning signal or shut down a system. In this type of application it is clearly advantageous to have a signal that does not turn on and off rapidly. However, the amount of hysteresis required for different temperature sensing applications, for example, may vary substantially, with a typical range being 0.5°–10° C.

The TMP-01 programmable temperature controller by Analog Devices, Inc., the assignee of the present invention, described in U.S. Pat. No. 5,225,811, "Temperature Limit Circuit With Dual Hysteresis", provides over- and under-temperature signals that incorporate an adjustable level of hysteresis. In the TMP-01 both the high and low temperature set points and the hysteresis levels are set by a common impedance circuit. The impedance circuit is a voltage divider that is connected between an external reference voltage pin provided by the TMP-01 and ground. The set points are determined by the ratios of the resistors in the voltage divider, and the hysteresis current is set by the divider's total resistance.

By using a common circuit to establish both the set points and the hysteresis, the TMP-01 can be offered in an 8-pin package. However, in this configuration the values of the resistors in the voltage divider are a function of both the desired set points and the desired hysteresis level. Users have had trouble computing the resistor values to obtain both the correct set points and hysteresis. Furthermore, adjusting the set points affects the hysteresis and vice versa.

Another problem occurs when the reference voltage pin is used to bias another circuit. If the circuit loads the reference voltage pin, the hysteresis current will be affected. The loading effects can be reduced by using a high impedance buffer between the external pin and the circuit, but this adds components which occupy valuable board space.

A programmable hysteresis circuit that provides a number of predetermined hysteresis levels and easily computable intermediate levels that are not dependent on the set points or affected by loading the IC's reference voltage is needed.

SUMMARY OF THE INVENTION

The present invention seeks to provide a method for independently establishing a set point and producing a hysteresis that can be adjusted between preset and intermediate levels through a programmable hysteresis input. This is accomplished by producing output signals when an input signal crosses respective set points and establishing a hysteresis in the output signals. When a comparator's output signal is "on", the input signal is shifted by a hysteresis differential. The output signal is terminated when the shifted input signal returns to the set point. A programmable hysteresis input is controlled to adjust the hysteresis differential to different preset and intermediate hysteresis levels.

For a better understanding of the invention, and to show how the same may be carried into effect, reference will now be made, by way of example, to the accompanying drawings.

DETAILED DESCRIPTION OF THE INVENTION

The programmable hysteresis circuit of the present invention can be used with a wide range of ICs, including sensors, controllers, analog-to-digital converters and comparators, to adjust the amount of hysteresis in the IC. In this way a standard chip can be used for a variety of applications, such as temperature sensing, that require different amounts of hysteresis. The invention will be described in conjunction with a programmable temperature controller, but it is generally applicable to many other ICs and electrical circuits. The temperature controller is provided with a hysteresis circuit for establishing a hysteresis, and an input pin for receiving a signal to adjust the magnitude of the hysteresis. The hysteresis is programmable between a number of preset and intermediate levels.

Figure 1:
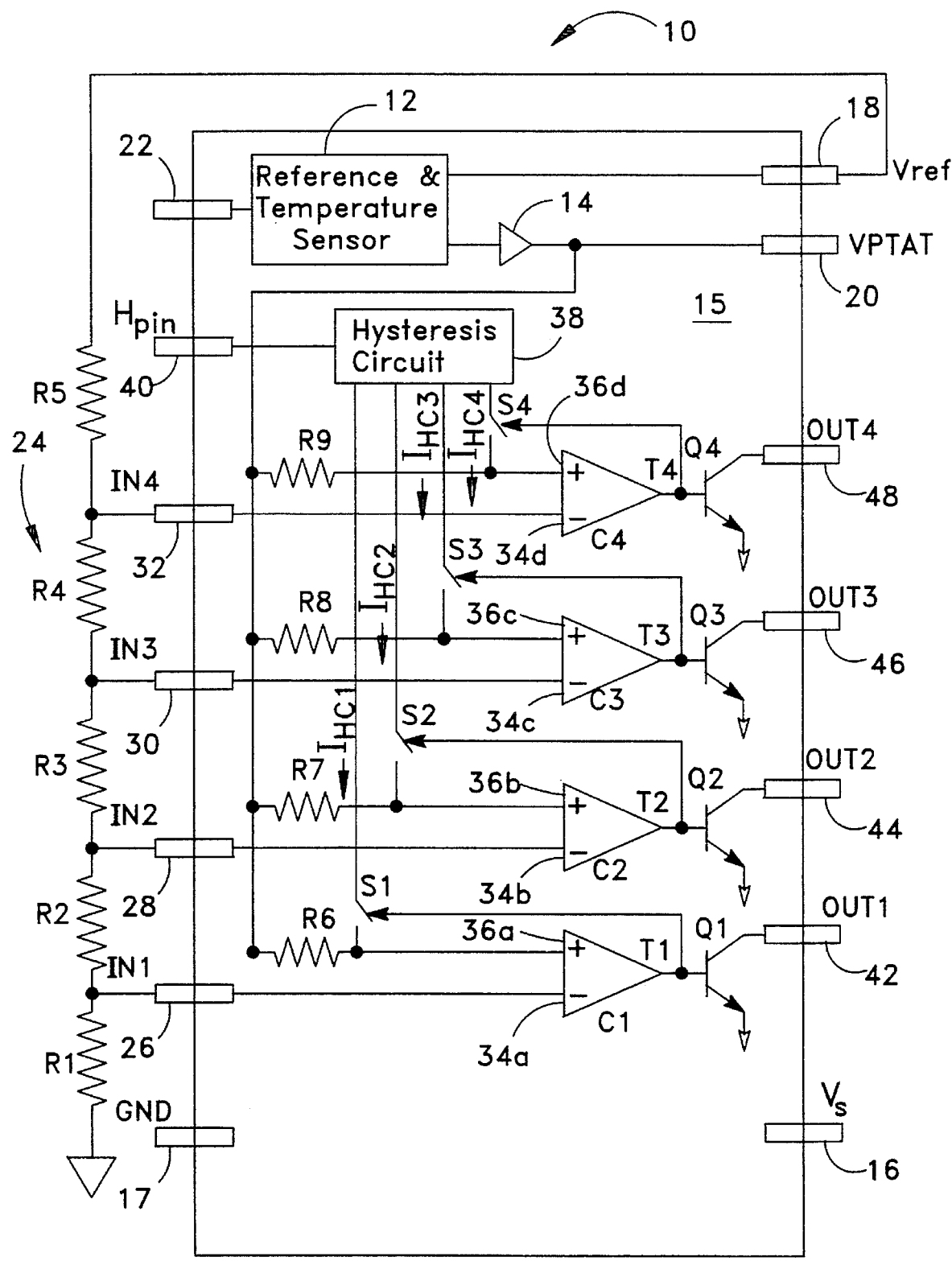
FIG. 1 is a schematic diagram of a programmable temperature controller IC and its external set point biasing circuitry.

As shown in FIG. 1, a programmable temperature controller IC 10 produces a voltage proportional to absolute temperature, and compares it to four set point voltages. When the temperature voltage exceeds a set point, the controller produces an "on" binary output voltage. For example, the controller may be used to monitor and control a power supply's temperature. When the first (lowest) set point is exceeded, the associated binary output voltage trips a fan that is used to cool the power supply. When the second set point is surpassed, the fan's speed is increased and a compressor is turned on to provide additional cooling. If the temperature rises higher than the third set point a warning signal is produced, and if the fourth and highest set point is traversed the power supply is shut down.

Hysteresis is built into the system to prevent the outputs from jittering on and off when the temperature voltage hovers close to one of the set points. Once the temperature voltage exceeds a set point it must fall back at least a hysteresis differential below the set point to switch the output "off". It would be very inefficient to turn the fan, compressor or entire system on and off every few seconds.

The temperature controller IC 10 includes a bandgap reference and temperature sensor 12 that is typically referred to as a "Brokaw" cell, and is disclosed in U.S. Pat. No.

5,225,811, "Temperature Limit Circuit With Dual Hysteresis." Separate temperature sensing and reference voltage circuits could be used. The Brokaw cell outputs a reference voltage $V_{ref}$, suitably 2.5 volts, and a voltage proportional to absolute temperature $V_{PTAT}$. $V_{PTAT}$ is amplified by amplifier 14, typically having a gain of 2.5, to give the controller a sensitivity of approximately 5 mV/°C. Since the output of amplifier 14 is also proportional to absolute temperature, it is also designated $V_{PTAT}$. The 16-pin IC package 15 includes a $V_S$ supply voltage pin 16 and a GND pin 17 for biasing the IC's internal circuitry. The supply voltage, suitably 5 volts, and ground are provided externally. For clarity the IC's internal supply voltage and ground connections are not shown. The IC includes a $V_{ref}$ pin 18 and a $V_{PTAT}$ pin 20 that are connected to the reference voltage $V_{ref}$ and amplified temperature voltage $V_{PTAT}$, respectively. To conserve power a shutdown feature is included for the temperature sensor. A shutdown pin 22 is connected internally to the temperature sensor and receives an externally applied signal.

The set point voltages are established externally so that they can be adjusted to the needs of the particular application. A voltage divider 24 consisting of five series resistors R1 through R5 is connected between the $V_{ref}$ pin and ground. The four set point voltages are tapped off of the voltage divider between each successive pair of resistors, and are connected to input pins IN1 (26) through IN4 (32), respectively. The ratio of the resistance between each tap and ground to the total resistance of the divider determines the value of the set point voltage for that tap. The voltage divider is preferably added by the user to establish the desired set points. Alternatively, programmable digital-to-analog converters (DACs) could be used to establish the set point voltages from digital inputs or the voltage divider could be internal to the IC.

The IC includes four comparators C1–C4 for comparing $V_{PTAT}$ to the respective set point voltages. The comparators' inverting inputs 34a–34d are connected to the input pins IN1–IN4, respectively. The amplified $V_{PTAT}$ is connected through resistors R6–R9 to the comparators' non-inverting inputs 36a–36d, respectively.

Figure 3:
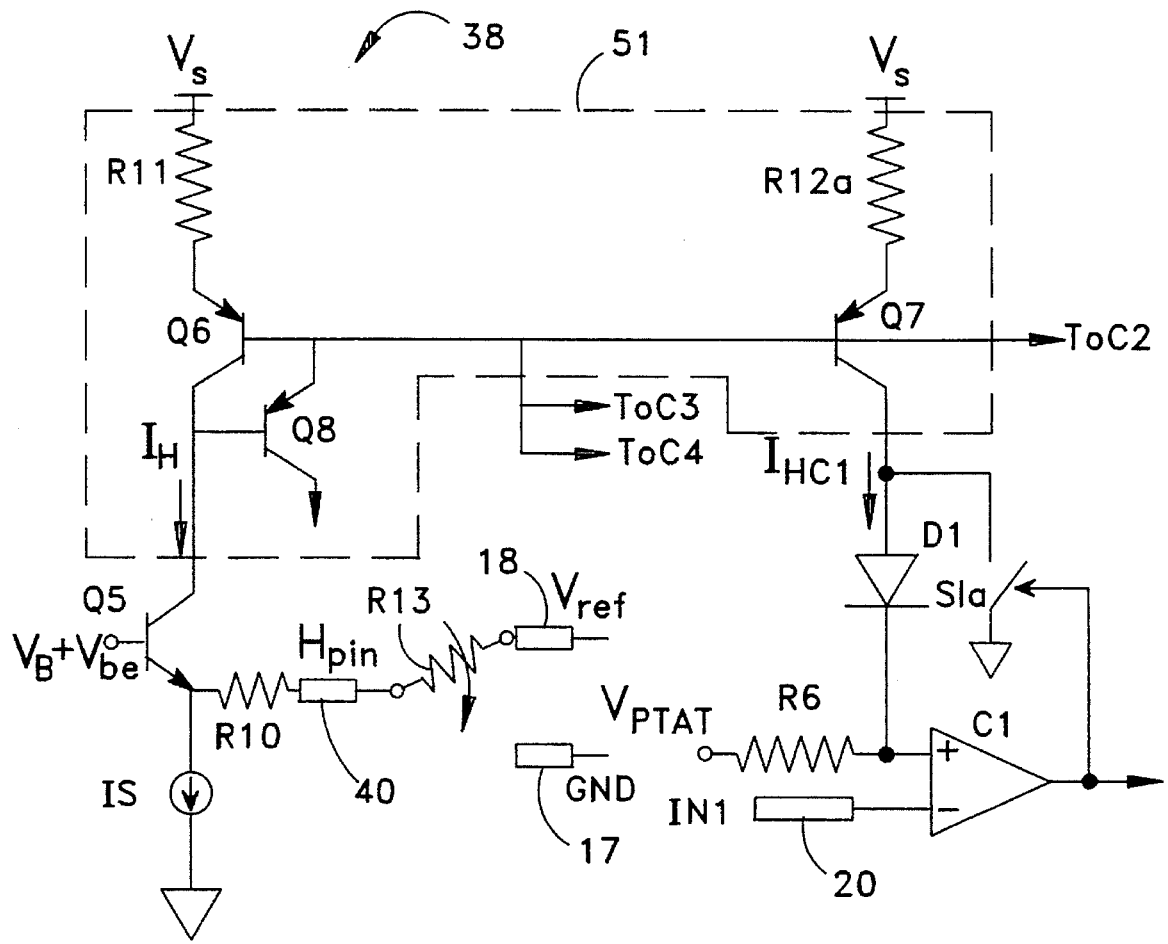
FIG. 3 is a schematic diagram of a hysteresis circuit for producing a hysteresis current and controlling the application of a hysteresis differential to a temperature signal.

A hysteresis circuit 38 produces hysteresis currents $I_{HC1}$, $I_{HC2}$, $I_{HC3}$ and $I_{HC4}$ that can be applied through switches S1–S4 to the comparators' non-inverting inputs, respectively, to shift the input signal, $V_{PTAT}$. A hysteresis pin $H_{pin}$ 40 is connected to the hysteresis circuit 38 and can be used to sink or source current to adjust the magnitude of the hysteresis currents. The preferred external connections for the hysteresis pin are shown in FIG. 3.

Because the input impedances to the comparators are very large, when the switches are open the voltages at the non-inverting comparator inputs substantially equal $V_{PTAT}$. When the switches are closed, the hysteresis $I_{HC1}$–$I_{HC2}$ currents flow through the respective resistors R6–R9, thus increasing the voltages at the non-inverting comparator inputs by a hysteresis differential. The switches are independently controlled by the voltage levels at the output terminals T1–T4 of the respective comparators.

If $V_{PTAT}$ rises above a particular set point voltage, the corresponding comparator's output goes high and closes its associated switch, allowing the associated hysteresis current to flow. $V_{PTAT}$ must then fall below the set point by at least the hysteresis differential before the comparator will switch low. In terms of the previous example, if the lowest set point is 373° K. and the hysteresis differential is 4° K., the first comparator will transition high at 373° K., turning on the fan, and will remain high until the temperature falls below 369° K. The same principle can be applied to sensing temperatures below set points by reversing the direction of the hysteresis current, switching the polarities of the comparators' inputs and closing the switch when the comparator output is low. When $V_{PTAT}$ falls below the set point, the comparator output turns "on" and stays "on" until $V_{PTAT}$ exceeds the set point by the hysteresis differential.

The circuit produces a corresponding output signal when any of the comparators turns "on". The output signals are preferably low voltages because it is typically more efficient to drive external circuitry from a low voltage. To invert the signals at the comparator output terminals T1–T4, the terminals are connected to the bases of npn transistors Q1–Q4, respectively. The transistors' collectors are connected to output pins OUT1–OUT4 (42, 44, 46 and 48), respectively, and their emitters are grounded. Therefore, if $V_{PTAT}$ exceeds a set point the corresponding output pin will assume a low voltage level.

Figure 2:
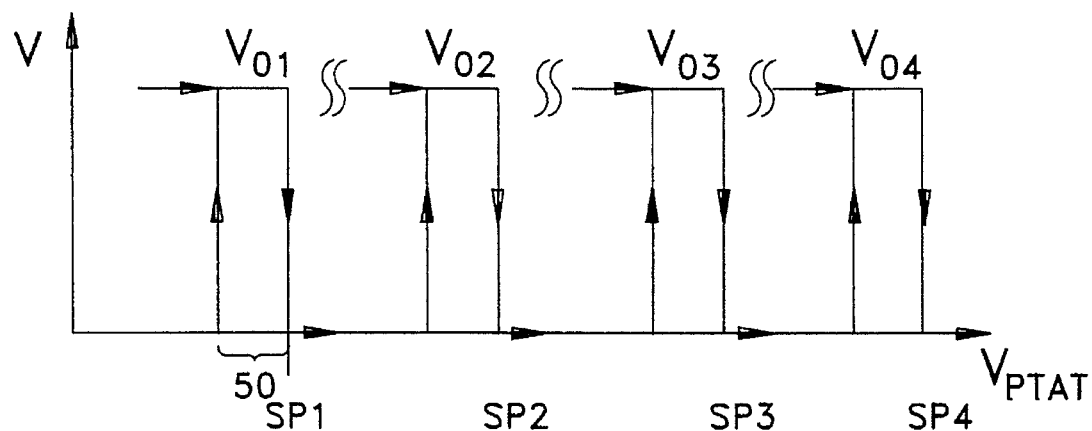
FIG. 2 is a hysteresis diagram for four over temperature outputs of the temperature controller of FIG. 1.

FIG. 2 is a plot of the voltage levels $V_{O1}$–$V_{O4}$ at the respective output pins OUT1–OUT4 versus $V_{PTAT}$. The voltages at the output pins remain high until $V_{PTAT}$ surpasses their corresponding set points SP1–SP4. When this happens the output voltage switches low, and stays low until $V_{PTAT}$ falls to at least a hysteresis differential 50 below the set point. The magnitudes of the hysteresis differentials are proportional to the respective hysteresis currents $I_{HC1}$, $I_{HC2}$, $I_{HC3}$ and $I_{HC4}$, and can be adjusted by sinking or sourcing current through the $H_{pin}$ 40.

As shown in FIG. 3 the hysteresis circuit 38 produces a hysteresis current $I_H$ that is mirrored to each comparator circuit. For purposes of explanation only the first comparator circuit C1 is shown, but similar circuitry is provided for the other comparators C2–C4. In the preferred embodiment a current source IS is connected to the emitter of an npn transistor Q5. The current source establishes the reference hysteresis current $I_H$, for example 15 μA, flowing through the transistor's collector. Q5's emitter is also connected through a resistor R10 to the hysteresis pin $H_{pin}$. Connecting the $H_{pin}$ to different voltages increases or reduces the amount of emitter current, and hence changes the hysteresis current $I_H$. The transistor's base is biased so that the voltage at the emitter is insensitive to fluctuations in temperature, and lies between ground and $V_{ref}$. For example, a suitable base voltage would be $V_b+V_{be}$ volts, where $V_{be}$ is the base-emitter voltage drop and $V_b$=2.011 volts, so that the emitter voltage is also 2.011 volts.

The hysteresis current $I_H$ flowing through Q5's collector is reflected through a current mirror 51 to the comparator C1 to supply the comparator's hysteresis current $I_{HC1}$. The current mirror comprises a pair of pnp transistors Q6 and Q7a having a common base connection, and emitter degeneration resistors R11 and R12a connected between their respective emitters and the supply voltage $V_S$. The collector of Q6 is connected to the collector of Q5 to supply the hysteresis current $I_H$, and the collector of Q7a mirrors the hysteresis current to comparator C1. The emitter and base of a transistor Q8 are connected to Q6's base and collector, respectively. The emitter degeneration resistors and transistor Q8 reduce the error between collector currents on either side of the current mirror that would otherwise result from mismatches between Q6 and Q7a. Alternatively, the current mirror could be a Wilson, cascode or base current mirror.

The hysteresis current $I_{HC1}$ supplied by Q7a will be equal to the current $I_H$ in Q6 if the transistors have equal emitter areas and the degeneration resistors have equal values. In general the current applied to the comparator can be a multiple or fraction of $I_H$. For example, if the emitter area of Q6 is n times greater than the emitter area of Q7a and the value of the degeneration resistor R12a is n times the value of R11, $I_{HC1}=I_H/(n)$. This property allows the hysteresis currents and hence the hysteresis differentials to be different for each set point. However, the magnitudes of the hysteresis differentials relative to each other are fixed for a given IC design, and cannot be altered via the hysteresis pin. Typically the hysteresis differentials for the different set points are all the same.

The switch S1 (shown in FIG. 1) is preferably implemented as a switch S1a and a diode D1. The switch S1a may be implemented by one or more transistors, which could be bipolar, MOSFETs, or JFETs. Similarly, the diode D1 may be replaced by one or more transistors, or anything which implements the diodes functionality as a cutoff valve. When the $V_{PTAT}$ voltage is lower than the voltage at IN1, C1's output is low. This closes switch S1a and shunts the hysteresis current $I_{HC1}$ to ground. Conversely, when the $V_{PTAT}$ voltage is higher than the voltage at IN1, C1's output switches high. This opens switch S1a, thus allowing the hysteresis current $I_{HC1}$ to forward bias and conduct current through diode D1. As the current flows through R6 it shifts the input signal ($V_{PTAT}$) by the hysteresis differential.

The reference hysteresis current $I_H$, and hence $I_{HC1}$ and the hysteresis differential, are adjustable by connecting the hysteresis pin $H_{pin}$ to different voltage levels. For example, $I_H$ can have three preset levels: low, medium and high. These levels correspond to connecting $H_{pin}$ to the $V_{ref}$ pin, leaving it unconnected and connecting it to the GND pin, respectively. An important aspect of the invention is that the user can select one of the three preset levels without providing any additional external biasing circuitry. In general, the number of preset levels would be limited only by the availability of reference voltages.

Leaving $H_{pin}$ unconnected has no effect on Q5's emitter current, and hence the medium level is determined by the reference hysteresis current provided by the current source IS. Tying $H_{pin}$ to $V_{ref}$, which is greater than the voltage at Q5's emitter, causes the pin to source current. Hence the current source IS draws less current through Q5, which reduces $I_H$. Conversely, tying $H_{pin}$ to ground causes it to sink current such that both IS and $H_{pin}$ draw current from Q5. The exact values for the high and low levels are determined by the selected voltage levels, such as 2.5 V for $V_{ref}$ and 0 V for ground, and by the value of R10. Intermediate hysteresis levels can be selected by tying $H_{pin}$ through a resistor R13 to $V_{ref}$ or GND.

The $H_{pin}$ setting for a desired hysteresis differential is described in Table 1 below.

TABLE 1

| Desired Hysteresis Differential (°C.) | $H_{pin}$ setting |
| --- | --- |
| H = $H_{low}$ | Tie to $V_{ref}$ |
| $H_{low}$ < H < $H_{med}$ | Tie to $V_{ref}$ Through $$R13 = \frac{R10*(H_{med} - H_{low})}{H_{med} - H} - R10$$ |
| H = $H_{med}$ | Leave Unconnected |
| $H_{med}$ < H < $H_{high}$ | Tie to Ground Through $$R13 = \frac{R10*(H_{high} - H_{med})}{H - H_{med}} - R10$$ |
| H = $H_{high}$ | Tie to Ground |

For example, under the following conditions: IS=15 μA, Q5's emitter voltage=2.011 V, R10=57.5 KΩ, R6=2 Ω, $I_{HC1}/I_H$=¼ and $V_{ref}$=2.5 V, the preset hysteresis levels would be $H_{low}$=0.5° C., $H_{med}$=1.5° C. and $H_{high}$=5° C. An intermediate hysteresis of 1° C. would be achieved by connecting a 40.3 KΩ resistor between the hysteresis pin and $V_{ref}$, and a hysteresis of 3° C. would result from connecting a 76.6 KΩ resistor between the pin and ground.

By providing a separate external hysteresis pin that is independent of the reference voltage pin, the hysteresis differential can be set without affecting the set point voltages and vice versa. The calculations for the voltage divider resistors for the desired set points and the calculations for the hysteresis resistor R13 are independent, and thus much simpler. Furthermore, the reference voltage pin can be used to bias other circuits without requiring a high impedance buffer to avoid loading the pin.

While several illustrative embodiments of the invention have been shown and described, numerous variations and alternate embodiment will occur to those skilled in the art. For example, while the invention has been described in terms of shifting the input signal to produce hysteresis, it may also be possible to produce hysteresis by shifting a set point, and making the set point shift programmable. Such variations and alternate embodiments are contemplated, and can be made without departing from the spirit and scope of the invention as defined in the appended claims.

We claim:

1. A method for programming hysteresis levels for an integrated circuit (IC), said IC having a sensing circuit for producing an output signal in response to an input signal and a hysteresis circuit for establishing a hysteresis in said output signal, said hysteresis circuit having a programmable hysteresis pin for selecting different hysteresis levels, comprising:

connecting said hysteresis pin to a low reference voltage to select a first preset hysteresis level;

connecting said hysteresis pin to a high reference voltage to select a second preset hysteresis level;

leaving said hysteresis pin unconnected to said low and high reference voltages to select a reference hysteresis level between said first and second preset levels and having a non-zero value; and connecting said hysteresis pin through a resistor to said low and high reference voltages to select intermediate levels between said first preset and said reference hysteresis levels, and said second preset and said reference hysteresis levels, respectively.

2. A method for providing programmable hysteresis levels, comprising:

providing an integrated circuit (IC) having a sensing circuit for producing an output signal in response to an input signal and a hysteresis circuit for establishing a hysteresis in said output signal, said hysteresis circuit having a programmable hysteresis pin for selecting different hysteresis levels, a ground pin for connection to ground reference potential, and a reference voltage pin for connection to a voltage supply;

connecting said hysteresis pin to said ground pin to select a first preset hysteresis level;

connecting said hysteresis pin to said reference voltage pin to select a second preset hysteresis level;

leaving said hysteresis pin unconnected to said ground and reference voltage pins to select a reference hysteresis level between said first and second preset levels and having a non-zero value; and connecting said hysteresis pin through a resistor to said ground and reference voltage pins to select intermediate levels between said first preset and said reference hysteresis levels, and said second preset and said reference hysteresis levels, respectively.

3. A method for providing programmable hysteresis levels, comprising:

providing an integrated circuit (IC) having a sensing circuit for producing an output signal in response to an input signal and a hysteresis circuit for establishing a hysteresis in said output signal, said hysteresis circuit having a current junction that is held at a known voltage and sinks a hysteresis current that sets a reference hysteresis level at a non-zero value and an internal resistor that is connected between the current junction and a hysteresis pin to adjust the hysteresis current in response to a voltage applied at the hysteresis pin to select different hysteresis levels, a ground pin for connection to ground reference potential to select a first preset hysteresis level as one of the different hysteresis levels, and a reference voltage pin for connection to a voltage supply to select a second preset hysteresis level as another one of the different hysteresis levels;

selecting the resistance of the internal resistor to set the first and second preset hysteresis levels without altering the reference hysteresis level;

connecting said hysteresis pin to said ground pin to select the first preset hysteresis level;

connecting said hysteresis pin to said reference voltage pin to select the second preset hysteresis level; and leaving said hysteresis pin unconnected to said ground and reference voltage pins to select the reference hysteresis level between said first and second preset levels.

4. A method for providing programmable hysteresis levels, comprising:

establishing a set point voltage;

applying an input voltage and the set point voltage to a comparator to switch a binary output voltage;

providing a hysteresis current at a current junction that is held at a known voltage level, said hysteresis current having a bias level that establishes a fixed reference hysteresis level;

reflecting said hysteresis current to a switch that controls its application to said comparator;

controlling the switch to apply said hysteresis current to said comparator when the binary output voltage is on to establish a hysteresis so that said binary output voltage remains on until said input voltage shifted by said hysteresis returns to the set point voltage;

connecting a resistor between the current junction and a hysteresis pin to establish a plurality of preset hysteresis levels;

applying a plurality of fixed voltage levels to the hysteresis pin to cause an adjustment current to flow through the resistor to vary said hysteresis current and select the respective preset hysteresis levels; and leaving the hysteresis pin unconnected to select the fixed reference hysteresis level.

* * * * *